United States Patent [19]

Ueno

[11] 4,306,112

[45] Dec. 15, 1981

[54] STEREOPHONIC RECEIVER NOISE ELIMINATING DEVICE

[75] Inventor: Eiji Ueno, Kawagoe, Japan

[73] Assignee: Pioneer Electronic Corporation, Tokyo, Japan

[21] Appl. No.: 70,470

[22] Filed: Aug. 28, 1979

[30] Foreign Application Priority Data

Aug. 28, 1978 [JP] Japan ............................. 53/104625

[51] Int. Cl.³ ............................................ H04H 5/00
[52] U.S. Cl. ............................. 179/1 GD; 179/1 GM
[58] Field of Search ............ 179/1 GD, 1 GE, 1 GH, 179/1 GM; 455/213; 329/50, 167

[56] References Cited

U.S. PATENT DOCUMENTS

| | | | |
|---|---|---|---|
| 4,002,991 | 1/1977 | Ogita | 179/1 GD |
| 4,037,165 | 7/1977 | Ogita | 179/1 GD |
| 4,047,116 | 9/1977 | Ogita | 179/1 GD |
| 4,164,624 | 8/1979 | Ogita | 179/1 GD |
| 4,195,203 | 3/1980 | Sakai et al. | 179/1 GD |
| 4,246,441 | 1/1981 | Sugai et al | 179/1 GD |

*Primary Examiner*—Douglas O. Olms
*Attorney, Agent, or Firm*—Sughrue, Mion, Zinn, Macpeak and Seas

[57] ABSTRACT

A circuit for eliminating pulsating electrical noise in a received and detected signal. A phase-locked loop circuit produces an output signal whose frequency and phase are identical to those of the stereophonic demultiplexer pilot signal of the composite detected signal. The output from the phase-locked loop circuit is subtracted from the pilot signal at a point prior to a switching circuit which disconnects the demodulated signal from the input of a stereophonic demultiplexer when noise is present and a level holding circuit maintains demodulated signal at the level it had immediately prior to its interruption. By completely removing the pilot signal from the composite signal prior to switching without otherwise varying the phase or frequency characteristics of the composite signal, distortions upon switching in the demodulated signal at low levels are eliminated.

4 Claims, 6 Drawing Figures

FIG. 1
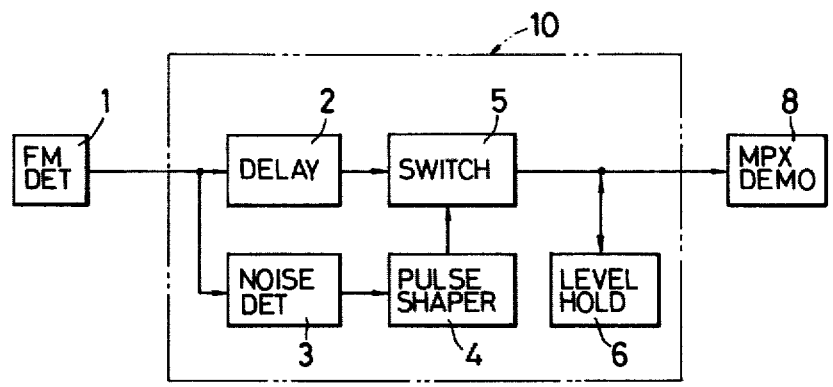
FIG. 2(a) 19kHz PILOT SIGNAL
T (GATE OFF PERIOD)
FIG. 2(b)
FIG. 2(c)
$t_1$ $t_2$

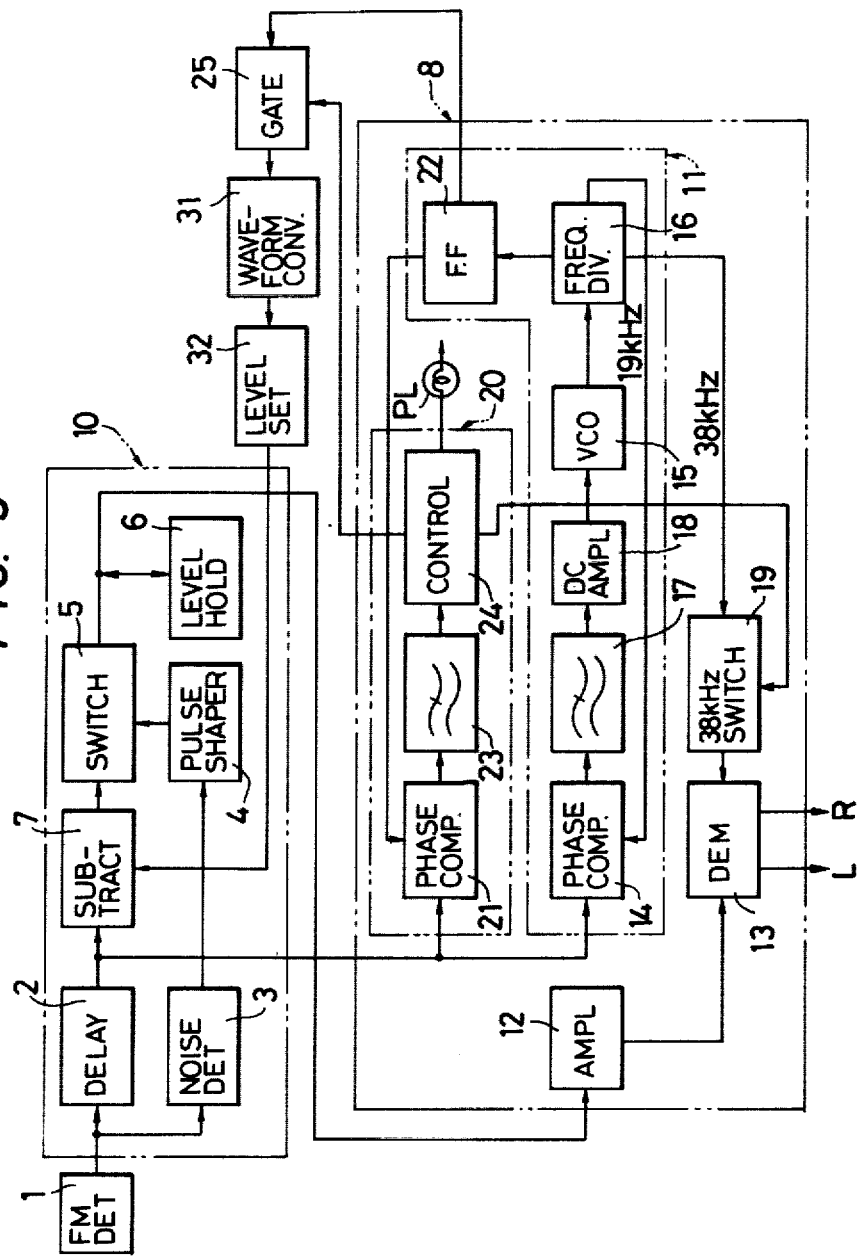

STEREOPHONIC RECEIVER NOISE ELIMINATING DEVICE

BACKGROUND OF THE INVENTION

The invention relates to receivers, and more particularly to a pulsating noise eliminating device in such a receiver.

In a receiver, especially in an FM receiver intended for automobile use, pulsating electrical noise emanating from the spark plugs of the vehicle and noise generated by the wiper often are a problem. Such pulsating noise can be eliminated to some extent by passing the received signal through a limiter circuit following intermediate frequency amplification. However, this technique for eliminating the pulsating noise is not entirely satisfactory. Accordingly, in order to more completely eliminate the pulsating noise, a further noise eliminating circuit 10 as shown in FIG. 1 has been employed at the output of the FM detector circuit in the receiver.

Specifically, an FM detected composite signal including a 19 KHz pilot signal formed at the output of an FM detector circuit 1 is applied to a pulsating noise detection circuit 3 which includes a high-pass filter which detects the presence of the noise. The output of noise detection circuit 3 triggers pulse shaping circuit 4. The shaping circuit 4 includes a monostable multivibrator which provides as its output control pulses of a predetermined duration.

The composite signal after passing through the delay circuit 2 is applied to a switching circuit 5 the on-off operation of which is controlled by output pulses from the monostable multivibrator 4. The switching circuit 5 operates to prevent the composite input signal from being applied to the next stage when the output pulses from the monostable multivibrator 4 so indicate. Accordingly, during such periods, the output of a level hold circuit 6 holds the level of the composite signal on the output switching circuit 5 at the level which it had immediately before the switching circuit 5 interrupted the signal. The outputs of the switching circuit 5 and the hold circuit 6 are applied to a multiplex demodulation circuit 8 which separates the signal into right and left channel signals.

FIGS. 2a-2c show waveform diagrams useful for more fully describing the operation of the circuitry shown in FIG. 1. FIG. 2a shows the FM detection signal including a 19 KHz pilot signal. If a pulsating noise signal (not shown) were to be superposed on the signal during the time period from the time instant $t_1$ on the time instant $t_2$, the monostable multivibrator 4 would be activated by the output of the high-pass filter 3 so that an inhibition pulse would be produced for a predetermined period T. Accordingly, during the period T, the switching circuit 5 remains in the interrupting state so that the signal is not transmitted. The signal level at the time instant $t_1$ which is held by the level hold circuit 6 is thus transmitted. As a result, a signal as shown in FIG. 2b is applied to the demodulation circuit 8. The signal obtained after the signal of FIG. 2b has passed through a low-pass filter (not shown) in the demodulation circuit 8 is as shown in FIG. 2c. Thus, the pulsating noise signal during the period T is eliminated. However, should the audio signal be very small in comparison with the 19 KHz pilot signal, a noise signal proportional to the level of the pilot signal would be generated during the period T.

In order to overcome this difficulty in one technique which has previously been employed, the 19 KHz pilot signal is completed during the non-conductive period of the switching circuit by use of a resonance circuit or an oscillator circuit. A second technique has been to remove the pilot signal by using a 19 KHz trap circuit or notch filter in the stage prior to the switching circuit while the 19 KHz signal needed for the multiplex demodulation circuit is applied thereto directly through a bypass around the switching circuit.

However, the first of these techniques is disadvantageous in that channel separation is degraded since a 19 KHz resonance circuit or oscillator circuit must additionally be provided in the signal path thereby distorting the frequency characteristics of the entire circuit near 19 KHz and shifting the phase of the signal. The second technique is also disadvantageous in that, as the audio information signal (15 KHz-23 KHz) in the vicinity of 19 KHz is affected, the frequency characteristics are distorted and the signal's phase is shifted.

SUMMARY OF THE INVENTION

Accordingly, an object of this invention is to provide a receiver having a pulsating noise eliminating circuit in which all of the above-described difficulties have been eliminated and the audio information signal is left unaffected.

In the noise eliminating circuit of a receiver according to the invention, a subtraction circuit is provided in the stage prior to a switching circuit and a control signal whose frequency and phase are precisely equal to those of a pilot signal is applied to the subtraction circuit so that the control signal is subtracted from a detected signal including the pilot signal whereby only the 19 KHz pilot signal is eliminated without affecting the other signal information. For the control signal equal in frequency and phase to the pilot signal, a signal locked at the pilot signal in a PLL (Phase-Locked Loop) in a stereophonic demodulation circuit is used.

Hereinafter, the present invention will be described in detail with reference to the drawings.

BRIEF DESCRIPTION OF THE DRAWINGS

FIG. 1 is a block diagram showing an example of a conventional noise eliminating device;

FIGS. 2a-2c show waveform diagrams useful for describing the operation of the device shown in FIG. 1;

FIG. 3 is a block diagram showing a preferred embodiment of the invention; and

DESCRIPTION OF THE PREFERRED EMBODIMENTS

Figure 4:
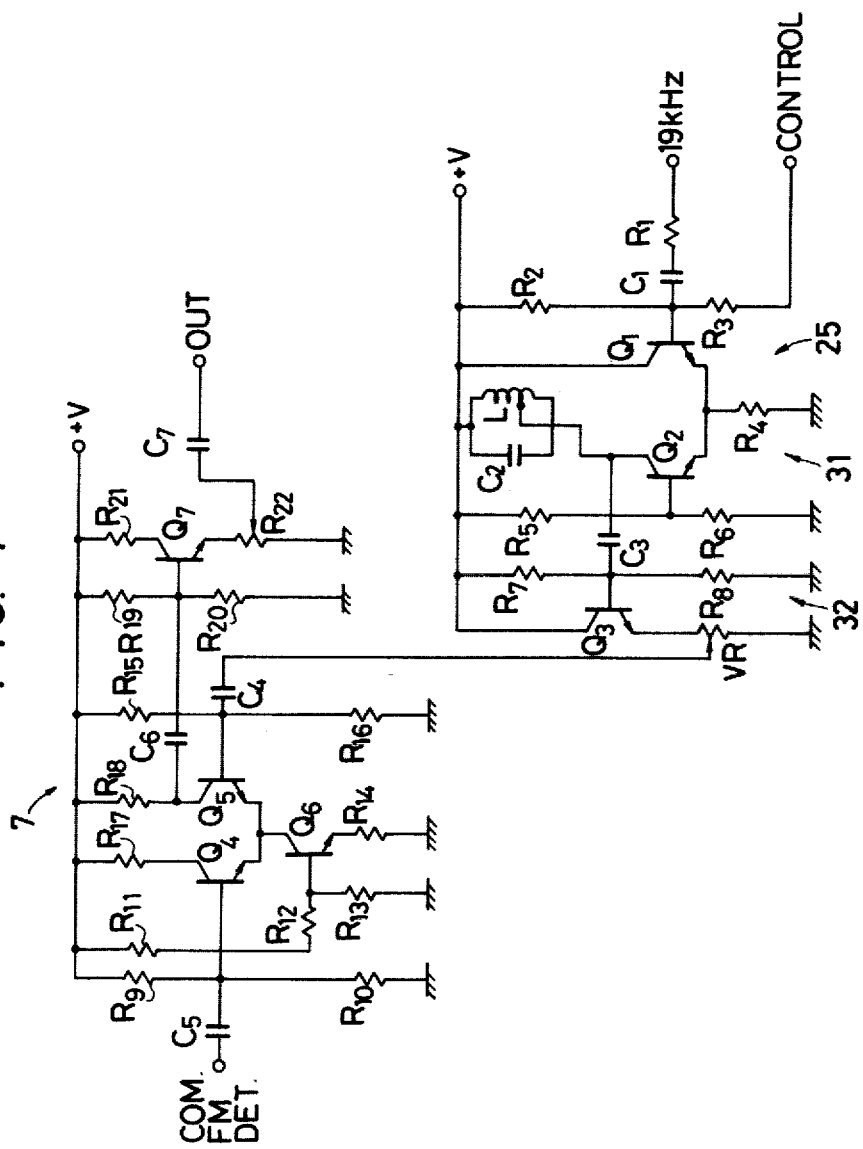
FIG. 4 is a circuit diagram showing specific examples of the circuits shown in FIG. 3.

FIG. 3 is a block diagram showing a preferred embodiment according to the invention in which the invention is embodied in an FM receiver. In FIG. 3, the same components shown in FIG. 1 are referenced with like numerals. A multiplex demodulation circuit 8 of a conventional construction employs therein a PLL circuit 11 to produce a 38 KHz subcarrier signal locked to a 19 KHz pilot signal. That is, a detected FM signal from a noise eliminating circuit 10 is amplified by an amplifier 12 and is then applied to a demodulator 13. The output, that is the composite signal of a delay circuit 2 in the noise eliminating circuit 10 includes a pilot signal which is applied to one input terminal of a phase comparator 14. A 76 KHz output of a VCO (voltage-controlled oscillator) 15 is frequency-divided into a 19 KHz signal by a frequency divider 16 and the 19 KHz signal is applied to the other input terminal of the comparator 14. The output of the comparator 14 is applied through a low-pass filter 17 to a d.c. amplifier 18 the output of which controls the phase of the output oscillation frequency of the VCO 15. A 38 KHz sub-carrier signal obtained from the frequency divider 16 is applied to a stereophonic demodulator 13 through a switch 19. As a result, the right and left channel outputs are obtained.

The 38 KHz sub-carrier signal switching circuit 19 operates to interrupt the transmission of the sub-carrier signal to the demodulator 13 during the reception of a monaural signal. For this purpose, a discriminator circuit 20 is provided for detecting the presence or absence of the pilot signal. In the descriminator circuit 20, the 19 KHz pilot signal of the composite FM detection signal is applied to one input terminal of a phase comparator 21. The 19 KHz output signal of the frequency divider 16 in the above-described PLL circuit 11 is applied to, for instance, a flip-flop 22 to provide a signal in phase with the input pilot signal and the signal thus generated is applied to the other input terminal of the comparator 21. The output of the comparator 21 is applied through a low-pass filter 23 to a control signal generating section 24. The control signal controls a stereophonic indicator lamp PL and the on-off operation of the aforementioned 38 KHz sub-carrier signal switching circuit 19.

In accordance with the present invention, the 19 KHz signal at the output of the flip-flop 22, which is locked to the pilot signal provided by the PLL circuit in the de-modulation circuit 8, is employed to eliminate the 19 KHz pilot signal from the composite FM detected signal in the stage prior to the switching circuit 5 in the pulsating noise eliminating circuit 10 without distortion of its frequency or phase characteristics.

For this purpose, a subtraction circuit 7 is provided between the switching circuit 5 and the delay circuit 2. The output signal of the flip-flop 22 in the multiplex demodulation circuit is coupled through a gate circuit 25, a waveform conversion circuit 31 and a level setting circuit 32 to one input of the subtraction circuit. The on-off operation of the gate circuit 25 is controlled by the control signal from the pilot signal discriminating circuit 20 so that during reception of a monoaural signal the gate circuit 25 blocks the 19 KHz signal to thereby prevent a free-running frequency signal generated in the PLL circuit from becoming the subtraction input of the subtraction circuit 7 to prevent erroneous operation of the noise eliminating circuit 10.

The waveform conversion circuit 31 operates to convert the square wave output of the PLL circuit into a sine wave signal which is applied to the level setting circuit 32. The level setting circuit 32 converts the impedance of the sine wave signal to a predetermined level. The output of the level setting circuit 32 is applied to the subtraction circuit 7.

FIG. 4 is a circuit diagram showing specific examples of the subtraction circuit 7, the gate circuit 25, the waveform conversion circuit 31 and the level setting circuit 32 shown in FIG. 3. The 19 KHz signal obtained from the PLL circuit 11 is applied to the base of a gating transistor $Q_1$ in the gate circuit 25 through a resistor $R_1$ and a capacitor $C_1$. The base of the transistor $Q_1$ is connected through a resistor $R_2$ to the positive power source. The above-described control signal produced by the control circuit 24 is applied through a resistor $R_3$ to the base of the transistor $Q_1$.

The waveform conversion circuit 31 includes a transistor $Q_2$ having as its collector load a 19 KHz resonant circuit which is a parallel combination of a capacitor $C_2$ and a coil L. The emitter of the transistor $Q_2$ is connected to the emitter of the gating transistor $Q_1$ to form a differential circuit. To this end, a reference voltage is applied to the base of the transistor $Q_2$ by means of the resistors $R_5$ and $R_6$. The emitters' common connection point is grounded through a resistor $R_4$.

Accordingly, if the above-described control signal is set to have a high level during receipt of a monaural signal and to have a low level for stereophonic signals, in the former case the transistor $Q_1$ will be saturated and the transistor $Q_2$ rendered non-conductive while in the latter case, both of the transistors $Q_1$ and $Q_2$ will be rendered conductive. In this manner, the gating function is performed by the transistor $Q_1$.

The 19 KHz output signal which has been converted into a sine wave signal by the tuning circuit is applied to the level conversion circuit 32 through a capacitor $D_3$. The signal thus applied is subjected to impedance conversion by an emitter follower circuit including a transistor $Q_3$, resistors $R_7$ and $R_8$ and a level setting variable resistor VR. The signal thus produced is applied to the subtraction circuit 7 through a capacitor $C_4$.

The subtraction circuit 7 includes a differential amplifier formed by a pair of transistors $Q_4$ and $Q_5$ the emitters of which are commonly connected. The composite FM detection signal and the 19 KHz output signal of the level setting circuit 32 are applied through capacitors $C_5$ and $C_4$ to the bases of the transistors $Q_4$ and $Q_5$, respectively. A transistor $Q_6$ and resistors $R_{11}$ through $R_{14}$ constitute a constant current source for the differential amplifier. Resistors $R_9$ and $R_{10}$, and resistors $R_{15}$ and $R_{16}$ determine the base bias values of the transistors $Q_4$ and $Q_5$, respectively. Resistors $R_{17}$ and $R_{18}$ are the collector loads of the transistors $Q_4$ and $Q_5$, respectively. The collector output of the transistor $Q_5$ is appied through a capacitor $C_6$ to an emitter follower circuit consisting of resistors $R_{19}$ through $R_{22}$ and a transistor $Q_7$ to subject the signal to an impedance conversion with the output level thereof being set to a desired value by the variable resistor $R_{22}$. The signal thus treated is applied through a capacitor $C_7$ to the switching circuit 5.

According to the circuitry described, only the 19 KHz pilot signal is completely eliminated from the composite FM detection signal in the differential amplifier of the subtraction circuit 7, and the audio information signal is completely unaffected so as to thereby achieve the primary object of the invention.

It is apparent to one of ordinary skill in the art that the invention is not limited to the above-described circuitry and that various modifications of the circuitry are possible. Furthermore, the technical concept of the invention can be applied not only to an FM receiver but also to a stereophonic AM receiver.

What is claimed is:

1. A receiver comprising means for eliminating a pilot signal from a composite signal indicating the pilot signal; detecting means for detecting a pulsating noise signal contained in said composite signal to provide a predetermined control signal; switching means for interrupting the transmission of an output signal of said eliminating means to a succeeding stage in response to said predetermined control signal for a period of time;

holding means for holding the level of said output signal at the level which it had immediately before an interruption operation of said switching means; and stereophonic demodulation means for demodulating the outputs of said switching means and holding means by utilizing said pilot signal, said demodulating means comprising signal generating means for generating a signal whose frequency and phase are equal to those of said pilot signal, and said eliminating means comprising subtracting means for forming a signal representing the difference between said composite signal and said signal generated by said signal generating means, the output of said eliminating means being applied to said switching means and being substantially free of said pilot signal, whereby said pilot signal has a substantially negligible effect on said output signal.

2. The receiver as recited in claim 1 wherein said signal generating means comprises a phase-locked loop having a voltage-controlled oscillator, a frequency divider for frequency-dividing the output frequency of said oscillator to a predetermined frequency, and a phase comparator for comparing the phases of the output signal from said frequency divider and said pilot signal, said voltage-controlled oscillator being controlled by a signal corresponding to the output of said comparator, and a signal according to signal in said phase-locked loop being coupled as one input signal to said subtracting means.

3. A device for eliminating noise in a stereophonic receiver comprising means for detecting a received and amplified signal including a pilot signal to produce a detected composite signal; means for producing a signal having the same frequency and phase as said pilot signal; means for subtracting said signal having the same frequency and phase as said pilot signal from said composite signal so as to remove said pilot signal from said composite signal; means for detecting the presence of predetermined noise components in the received signal; means for retaining, in response to an output from said noise components detecting means, the signal from which the pilot signal has been removed at the level which it had prior to said noise components being detected, whereby said pilot signal has a substantially negligible effect on said means for retaining.

4. The noise eliminating device of claim 3 wherein said means for producing a signal having the same frequency and phase as said pilot signal comprises a phase-locked loop having an input coupled to a source of the detected signal; said phase-locked loop comprising a phase comparator, a voltage-controlled oscillator coupled to an output of said phase comparator and a frequency divider coupled to the output of said voltage-controlled oscillator.

* * * * *